United States Patent [19]

Milkovic

[11] Patent Number: 4,733,171

[45] Date of Patent: Mar. 22, 1988

[54] DIFFERENTIAL SWITCHED-CAPACITOR DUAL SLOPE WATTHOUR METER CIRCUIT

[75] Inventor: Miran Milkovic, Scotia, N.Y.

[73] Assignee: General Electric Company, Schenectady, N.Y.

[21] Appl. No.: 10,607

[22] Filed: Feb. 4, 1987

[51] Int. Cl.[4] ............................................. G01R 11/02
[52] U.S. Cl. ..................................... 324/142; 324/141; 364/483
[58] Field of Search ........................ 324/142, 141, 134; 328/127; 333/19, 173; 364/483

[56] References Cited

U.S. PATENT DOCUMENTS

| | | | |
|---|---|---|---|
| 3,764,908 | 10/1973 | Elms | 364/483 X |
| 3,955,138 | 5/1976 | Milkovic | 324/107 |
| 4,066,960 | 1/1978 | Milkovic | 324/142 |
| 4,217,546 | 8/1980 | Milkovic | 324/142 |
| 4,485,343 | 11/1984 | Milkovic | 324/142 |
| 4,495,463 | 1/1985 | Milkovic | 324/142 |
| 4,535,287 | 8/1985 | Milkovic | 324/142 |
| 4,550,295 | 10/1985 | Sasaki | 328/127 X |
| 4,682,102 | 7/1987 | Milkovic | 324/142 X |

Primary Examiner—Reinhard J. Eisenzopf
Assistant Examiner—Vinh P. Nguyen
Attorney, Agent, or Firm—Marvin Snyder; James C. Davis, Jr.

[57] ABSTRACT

Transient offset error voltages due to charge injection by MOS analog switches and DC offsets of multipliers in switched-capacitor integrators of electronic metering circuits are compensated by the common mode rejection of a differential switched-capacitor integrator. To cancel internal DC offset voltages of the integrator amplifier, a series capacitor connected to the inverting input of the amplifier is charged, during the autozero phase of the clock cycle, to a voltage equal to the internal DC offset voltage of the amplifier and subsequently, during the integration phase of the clock cycle, this voltage is applied to the inverting input of the amplifier.

18 Claims, 4 Drawing Figures

DIFFERENTIAL SWITCHED-CAPACITOR DUAL SLOPE WATTHOUR METER CIRCUIT

BACKGROUND OF THE INVENTION

This invention relates generally to an electronic energy consumption metering circuit capable of being fabricated on an integrated circuit chip, and more particularly to the compensation of charge injection offset caused by metal oxide semiconductor (MOS) analog switches and DC offsets caused by multipliers and the like employed in such circuit.

Electronic circuits for measuring electrical energy consumption in an electrical system, such as an AC power distribution system, are well known. Typically, these circuits may comprise a switched time division multiplier for multiplying two signals representative of the instantaneous current and voltage in the electrical system and for providing a product signal which is representative of the instantaneous power being supplied by the electrical system. The product signal from the multiplier may be integrated in an integrator circuit to provide a signal representative of the average power or energy consumption, and this signal may be converted to a pulse train in which each pulse represents a predetermined unit quantity of energy. The pulses may be counted or accumulated to provide a measure of total energy consumption. This basic technique of electronic metering is described, for example, in U.S. Pat. No. 3,955,138 which issued to the present inventor, and various electronic metering circuits employing this technique are disclosed in other patents of the present inventor, including U.S. Pat. Nos. 4,066,960; 4,217,546; 4,485,343; 4,495,463; and 4,535,287. The foregoing patents are all commonly assigned with the present invention to General Electric Company, and are incorporated by reference herein. This application is also related to the commonly assigned application of the present inventor, Ser. No. 010613 pending filed concurrently herewith.

While the electronic circuits disclosed in the foregoing patents are capable of accurate metering and perform satisfactorily, it is desirable to improve their accuracy and reduce their cost and size by fabricating each of the respective circuits on a respective solid state semiconductor monolithic integrated circuit chip. It is relatively easy to fabricate components such as analog switches, amplifiers, logic elements, etc. on silicon chips using, for example, MOS technology. The present inventor's commonly assigned copending application Ser. No. 812,369, now U.S. Pat. No. 4,682,102, filed Dec. 23, 1985, and Ser. No. 947,114, filed Dec. 29, 1986, which applications are incorporated by reference herein, disclose improved switched-capacitor electronic metering circuits which are capable of being fabricated entirely on integrated circuit chips. These metering circuits have an automatic offset error correction loop which employs dual slope integration that substantially compensates for system offset error voltages. The analog switches employed in the circuits comprise metal oxide semiconductor field effect transistors (MOSFETs) and introduce transient offset error voltages due to charge injection. In addition, the multiplier used in the circuits, and possibly the sensors which monitor the line current, have DC offsets. These may not be fully compensated by the system offset correction loop. These uncompensated offset voltages introduce error and limit accuracy of the metering circuits.

It is desirable to eliminate or reduce the effects of charge injection offset caused by MOS analog switches and the DC offset voltages of multipliers and the like in order to improve dynamic performance and accuracy of switched-capacitor electronic metering circuits, and the present invention is directed to this end.

SUMMARY OF THE INVENTION

The present invention constitutes an electronic metering circuit in which charge injection and DC offset errors are substantially compensated and which affords improved dynamic performance and metering accuracy. The circuit employs a differential switched-capacitor integrator and switched-capacitor networks arranged so that offset voltages due to charge injection from integrated circuit switches and DC offsets from multipliers and the like are supplied to both the inverting and non-inverting inputs of the differential integrator amplifier and are cancelled due to common mode rejection.

Briefly stated, in one aspect the invention contemplates an electronic circuit for measuring energy consumption in an electrical system that comprises multiplying means responsive to a voltage and current in the electrical system for providing first and second signals representative of instantaneous power in the electrical system, the first and second signals being of equal magnitude and opposite polarity, and a switched-capacitor integrator for integrating the signals to provide a third signal representative of average energy. The integrator comprises a differential amplifier having an inverting input and a non-inverting input and a feedback capacitor connected between an output of the amplifier and the inverting input, a first switched-capacitor network connected between the inverting input and the multiplying means for supplying the first signal to the inverting input, and a second switched-capacitor network connected between the non-inverting input and the multiplying means for providing the second signal to the non-inverting input. Each of the first and second switched-capacitor networks comprises an input capacitor and analog switches for connecting the respective input capacitor alternately to the multiplying means and its respective integrator input and to a reference potential, and means for operating the switches of the first and second switched-capacitor networks such that the first and second signals are provided substantially simultaneously to the integrator inputs and the input capacitors are repeatedly switched between connection to the multiplying means and its respective integrator input and connection to the reference potential.

In another aspect, the invention contemplates an electronic circuit for measuring energy consumption in an electrical system comprising multiplying means for providing first and second signals of equal magnitude and opposite polarity which are representative of instantaneous power in the electrical system, and a switched-capacitor integrator for integrating the first and second signals to provide a third signal representative of average power. The switched-capacitor integrator comprises a differential amplifier having an inverting and a non-inverting input, and first and second switched-capacitor networks connected between the multiplying means and the inverting and non-inverting inputs, respectively, for periodically supplying to the differential amplifier inputs simultaneous samples of the first and second signals.

In yet another aspect, the internal DC offset voltages of the differential amplifier of a differential switched-capacitor integrator are compensated by providing an input capacitor connected to the inverting input of the amplifier, and switching means for charging the input capacitor to a voltage equal to the internal DC offset voltage of the amplifier during a first time period and for applying the input capacitor voltage to the inverting input along with a signal representative of the instantaneous power in the electrical system during a second time period.

DESCRIPTION OF THE PREFERRED EMBODIMENTS

The present invention is especially well adapted for use in electronic circuits fabricated in integrated circuit form for measuring energy consumption, as in watt-hours, in an electrical system such as a single or polyphase AC power distribution system, and will be described in that context. However, as will become apparent, this is illustrative of only one utility of the invention.

Figure 1:
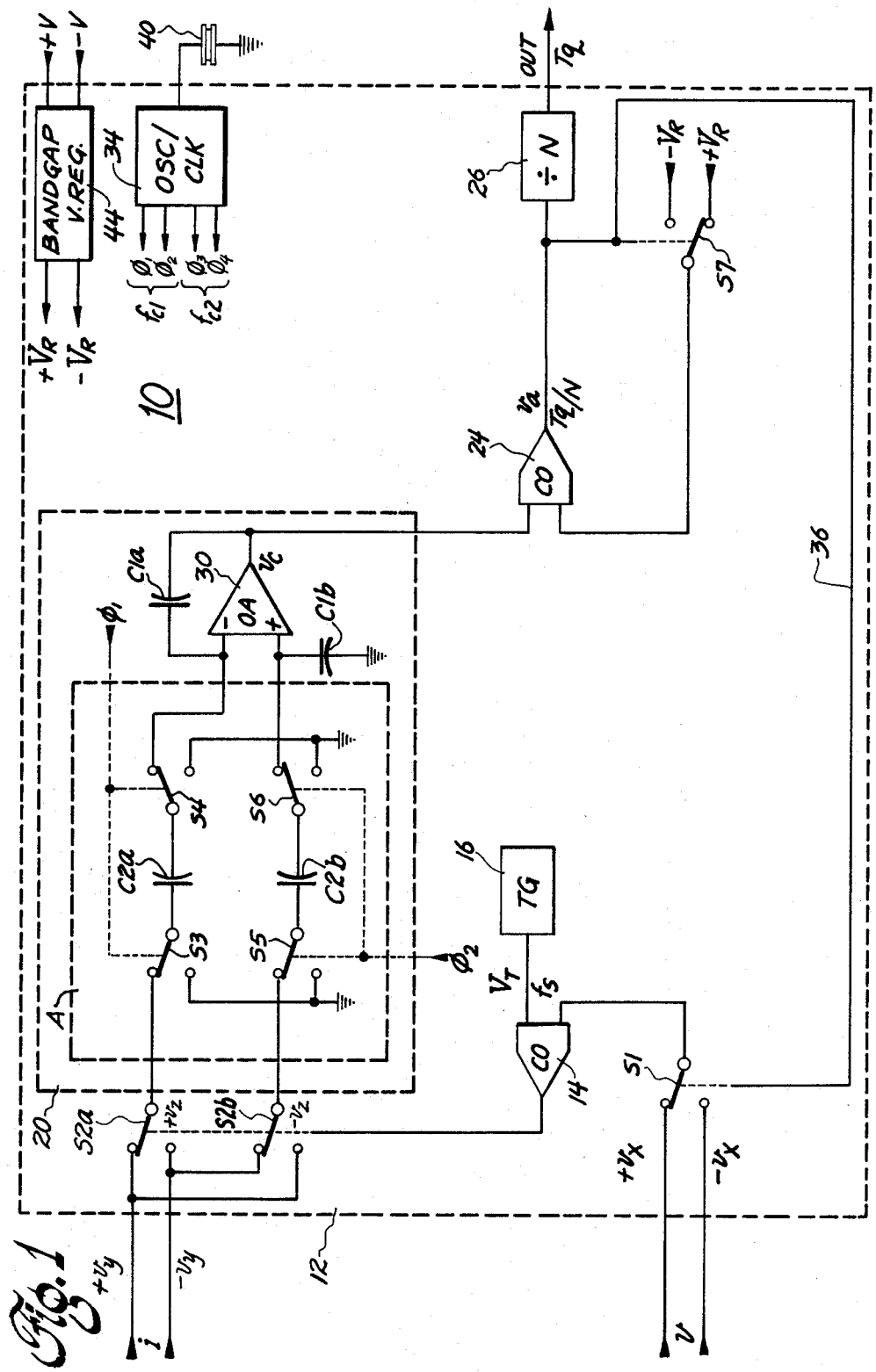
FIG. 1 is a schematic diagram of an electronic circuit employing a differential switched-capacitor integrator with charge injection and DC offset compensation for measuring energy consumption in a single phase electrical system.

FIG. 1 illustrates a preferred form of energy consumption metering circuit 10 in accordance with the invention for measuring energy consumption (in watt-hours, for example) in a load connected to a single phase AC power distribution system (not illustrated). As will be described in more detail herein, metering circuit 10 may be fabricated in integrated circuit form, preferably on a single monolithic MOS semiconductor integrated circuit chip 12. The instantaneous load voltage v and instantaneous load current-i in the electrical system may be sensed by conventional means, and corresponding voltages $v_x$ and $v_y$ which are proportional to the load voltage and load current, respectively, may be supplied to circuit 10. Voltage $v_x$ may be derived, for example, from the secondary of a voltage transformer (not illustrated) connected across the voltage lines of the electrical system. Voltage $v_y$ may comprise the voltage developed across a sensing resistor (not illustrated) due to current flowing through the resistor from a current transformer (also not illustrated) which monitors the load current. The voltages $v_x$ and $v_y$ may be inverted, as by inverter amplifiers (not illustrated), and the inverted voltages $-v_x$ and $-v_y$ may also be supplied to circuit 10. Voltages $+v_x$ and $-v_x$ are preferably supplied to the terminals of a first analog switch S1, and voltages $+v_y$ and $-v_y$ are preferably supplied to the terminals of second and third analog switches S2a and S2b, as shown.

As will be described in more detail herein, circuit 10 may further include a time division multiplier comprising a comparator (CO) 14, a triangular waveform sampling frequency generator (TG) 16 and analog switches S2a and S2b. The time division multiplier multiplies voltages $v_x$ and $v_y$ (or inverted forms thereof) together to form voltage $+v_z$ at the output of switch S2a and voltage $-v_z$ at the output of switch S2b. Voltages $\pm v_z$ correspond to the product of the two input voltages. Since the two input voltages $v_x$ and $v_y$ are proportional, respectively, to instantaneous load voltage and load current, their product $\pm v_z$ is proportional to instantaneous power being supplied by the electrical system. The signals $\pm v_z$ may be integrated to convert them into a signal $v_c$ proportional to average energy and quantized into a train of signal pulses $v_a$, each pulse of which represents a predetermined amount of energy, by an analog-to-pulse rate converter comprising a differential switched-capacitor integrator 20 and a comparator (CO) 24. Voltage $v_a$ from comparator 24 may be supplied to a divider 26, such as a binary divider, which divides the pulse train by a factor N to provide an output pulse train having a pulse period $T_q$. The pulses from the divider may be accumulated or counted and displayed in a register/display (not illustrated) to provide an indication of energy consumption.

Comparator 14 of the time division multiplier receives at a first input either the voltage $+v_x$ or the voltage $-v_x$ from switch S1, and receives at a second input a triangular voltage waveform $V_T$ of frequency $f_s$ from sampling frequency generator 16. Comparator 14 constitutes a pulse width modulator which outputs pulse-width modulated pulses, wherein the instantaneous pulse width of an output pulse is proportional to the corresponding instantaneous magnitude of input voltage from switch S1. The pulse width modulated output signal of the comparator controls the position of switches S2a and S2b so that each of output voltages $\pm v_z$ from the switches comprises a train of pulses which alternate in polarity. Magnitude of any given pulse in this train is proportional to line current while width or mark-space ratio of the pulses is proportional to line voltage. Thus voltages $\pm v_z$ are proportional to instantaneous power, as explained, for example, in aforementioned U.S. Pat. No. 3,955,138. The time division multiplier output product voltages $\pm v_z$ are preferably provided about 100 times for each period of the line frequency. Accordingly, for a 60 Hz line frequency, sampling frequency $f_s$ provided by sampling frequency generator TG is preferably of the order of 6 KHz.

Differential switched-capacitor integrator 20, which integrates the product signals $\pm v_z$, is a dual slope integrator, as will be described, and may comprise an operational amplifier (OA) 30, a feedback capacitor C1a connected between the output of the amplifier and its inverting (−) input, a capacitor C1b having the same value as capacitor C1a connected between the noninverting (+) input of the amplifier and a reference potential such as ground, and a switched input capacitor network A comprising a pair of capacitors C2a and C2b, having the same value, connected with corresponding pairs of analog switches S3, S4, and S5, S6, respectively, in parallel. The switches may be controlled by clock phase signals $\phi_1$, $\phi_2$ derived from an oscillator/clock generator 34 fabricated directly on chip 12. The clock phase signals are non-overlapped and 180 degrees out of phase. Frequency $f_{cl}$ of the clock signals is preferably high in relation to frequency $f_s$ of sampling frequency generator 16, and may be, for example, of the order of 30 KHz.

Switches S3 and S4 are operated together as a pair and switches S5 and S6 are operated together as a pair to connect capacitors C2a and C2b either to the outputs of switches S2a and S2b, respectively, and to the inverting (−) and non-inverting (+) inputs of the operational amplifier, respectively, or to a reference potential such as ground. Thus, when switches S3, S4, S5 and S6 are in the positions illustrated in FIG. 1, capacitor C2a provides signal $+v_z$ to the inverting input of differential amplifier 30 of the integrator, and capacitor C2b provides signal $-v_z$ to the non-inverting input of the amplifier. Thus, the effective input signal to the amplifier is $+2v_z$, which is double the value of the input signal to a non-differential integrator. As a result, the differential integrator affords a 6 dB improvement in signal-to-noise ratio over a non-differential integrator. When clock signals $\phi_1$ and $\phi_2$ reverse phases, the positions of switches S3–S6 reverse, causing capacitors C2a and C2b to be connected to ground. Switches S3–S6, in combination with capacitors C2a and C2b, effectively constitute a sampling circuit which samples signals $+v_z$ and $-v_z$, and supplies the sampled signals to the integrator amplifier. The effective input signal is integrated up in capacitor C1a. Thus, output signal $v_c$ of amplifier 30 is a ramp signal with a constant slope formed by superimposed small steps due to sample integration. In addition, a $2\omega t$ component is superimposed upon the ramp signal due to the effect of multiplication of the input voltages. This component, is substantially cancelled out in balanced polyphase loads. For a single phase meter, as in FIG. 1, and for unbalanced polyphase loads, this component is preferably removed before integration, as by using low pass filters. The integrator output signal $v_c$ is thus the time integral of the effective input voltage $v_z$ with a time constant of $(C1/C2) T_{c1}$, where C1 is the value of capacitors C1a and C1b, C2 is the value of capacitors C2a and C2b and $T_{c1}=1/f_{c1}$. Output signal $v_c$ represents the average energy being consumed in the electrical system.

Signal $v_c$ from integrator 20 may be quantized and converted into a train of signal pulses $v_a$ by comparator 24 wherein each pulse represents a fraction 1/N of a predetermined quantity of energy, where N is the divisor of a divider 26. Signal $v_c$ from the integrator may be supplied to one input of comparator 24, and a reference voltage $+V_R$ or $-V_R$ may be supplied to the other input of the comparator as determined by the position of a switch S7. Switch S7 is controlled by the output of the comparator to switch between the two reference voltages, and the output of the comparator is also fed back via a conductor 36 to control the position of switch S1. During a first time period $T_u$, switch S7 may be in the position shown and integrator 20 may integrate the effective input signal $v_z$ upwardly so that the output ramp voltage $v_c$ from the integrator increases. When this voltage reaches the positive reference voltage, the comparator output voltage goes high to produce an output pulse. This pulse operates switch S7 to reverse polarity of the reference voltage to comparator 24 and operates switch S1 to reverse polarity of the input voltage v to comparator 14 of the time division multiplier. This reversal of polarity from $+v_x$ to $-v_x$ at the input to comparator 14 reverses polarity of the effective input voltage to integrator 20 and causes the integrator to integrate downwardly during the next time period $T_d$. Upon the output signal from the integrator reaching the negative reference voltage, comparator 24 changes state by going low, which again reverses polarity of input voltage v to comparator 14 so that the integrator starts to integrate upwardly again. This cycle repeats with integrator 20 integrating first in one direction and then the other. Thus, the integrator is a dual slope integrator and output voltage $v_a$ of comparator 24 is in the form of a pulse train wherein each pulse represents a predetermined amount of energy. Assuming for the moment that divider 26 is not present, i.e., N=1, the energy per output pulse is $$W_q = (k_1 V_R^2/k f_{c1}) \, C1/C2 \text{ (Joules)} \tag{1}$$

and the output rate is $$1/T_q = (k f_{c1}/k V_R^2) \, (C2 C1) \, VI \cos \phi (1/\text{sec.}) \tag{2}$$

where $k_1$ and k are dimensional constants, $VI \cos \phi$ is the load power, $V_R$ is the reference voltage, and $f_{c1}$ is the clock frequency.

From Equation (1), it can be seen that energy per output pulse depends only on clock frequency $f_{c1}$, reference voltage $V_R$, and the ratio C1/C2. Thus, accuracy with which energy may be measured depends upon accuracy of these terms. It is desirable that circuit 10 have an accuracy of ±0.1%. Oscillator/clock generator 34 may be controlled by a crystal 40 so that clock frequency $f_{c1}$ has an accuracy much greater than ±0.1%. Reference voltages $±V_R$ may be derived from voltages $+V$ and $-V$ by a bandgap voltage regulator 44 fabricated directly on chip 12, and the voltage regulator may be formed to be quite accurate using conventional techniques. As to the capacitor ratio, it is relatively easy to match the temperature and voltage coefficients of capacitors formed on a single silicon chip so that these coefficients track each other over a relatively wide range of temperature and voltage. Thus it is possible to obtain a desired capacitor ratio which is accurate to within ±0.1%, even though the absolute values of the capacitors may vary substantially from the target values.

As described in the aforementioned application Ser. No. 947,114, divider 26 enables the capacitance ratio of the feedback capacitor to the input capacitors of switched-capacitor integrator 20 to be substantially reduced (by a factor corresponding to the reciprocal of the divisor N) so that the capacitance values are of the same order of magnitude. This produces a corresponding increase in integration speed, enables better matching of the capacitors, permits reduction of chip area, and affords substantially improved linearity.

The circuit of FIG. 1 affords automatic compensation of system offset voltages. This is accomplished since, during up-integration period $T_u$ of input signals $+v_z$ and $-v_z$, system error voltages are integrated up, causing a time error of $+T_e$. However, when the integrator 20 output voltage reaches the reference voltage level and the comparator 24 output voltage changes state, input voltage v to comparator 14 reverses polarity, as previously described, causing polarity of each input signal $+v_z$ and $-v_z$ to reverse, so that the integrator integrates down during down-integration interval $T_d$. Although the integrator input signals reverse polarity, the system offset error voltage does not and causes a time error of $-T_e$. Therefore, during the total period $T_u+T_d$, the offset time errors are subtracted and thus automatically eliminated.

As previously noted, circuit 10 is preferably fabricated entirely on a single integrated circuit chip. The various analog switches employed in the circuit are preferably MOS integrated circuit switches which are formed in conventional manner and which employ field effect transistors (FETs). The switches are controlled by application of gate voltages to the FETs. When a FET is turned off, as by application of a negative gate voltage for example, there is no channel through the FET. When a positive gate voltage is applied, a channel is created due to inversion and charge is injected into the channel so that it conducts. Charge is stored in stray capacitances as, for example, between the source and drain and the substrate. When the FET is turned off, the charge flows out through the source and drain connections. Charge injection produces a transient offset error voltage which is added to the signal being processed. Such offset error voltage is usually too large to be fully compensated by the system automatic offset compensation loop described above. In addition, comparator 14 and switches S2a and S2b may produce DC offsets which are imposed on the signals $\pm v_z$, and the voltages $\pm v_y$ themselves may contain DC offsets introduced by sensor circuits which also are not fully compensated by the automatic offset compensation loop. These offsets cause errors in the integration which limit accuracy of the metering circuit.

In accordance with the invention, offset voltages due to charge injection and DC offsets of multipliers and the like are compensated and substantially eliminated in circuit 10 by taking advantage of the common mode rejection characteristics of differential integrator amplifier 30. When switches S3–S6 of switched-capacitor network A are in the positions illustrated, equal and opposite input voltages $\pm v_z$ are applied to the inverting and non-inverting inputs of the differential amplifier. As previously described, this effectively supplies a total input voltage of $\pm 2v_z$ to the amplifier. In addition, switches S3 and S4, as well as switch S2a, inject charge into the inverting input which produces a transient offset error voltage. However, at the same time, switches S5, S6 and S2b also inject charge into the non-inverting input of the amplifier. Since charge injection produced by an integrated circuit analog switch is a function of its geometry, by fabricating the switches such that charge injected into the inverting input of the amplifier is of equal magnitude and like polarity to the charge injected into the non-inverting input, the offset voltages produced by such charge injection will be cancelled due to the common mode rejection characteristics of the amplifier. This may be insured by fabricating switches S2a, S3 and S4 to have the same geometries as corresponding switches S2b, S5 and S6, respectively. Furthermore, since any DC offset voltages due to comparator 14, switch S1 or sampling frequency generator 16, and any DC offsets in voltages $\pm v_y$ would be applied equally to the voltages $\pm v_z$, these offsets are also cancelled by the common mode rejection characteristics of the integrator amplifier. Thus, by employing both the automatic offset compensation loop previously described and the differential integrator in combination, the effects of offset error voltages may be substantially reduced.

Figure 2:
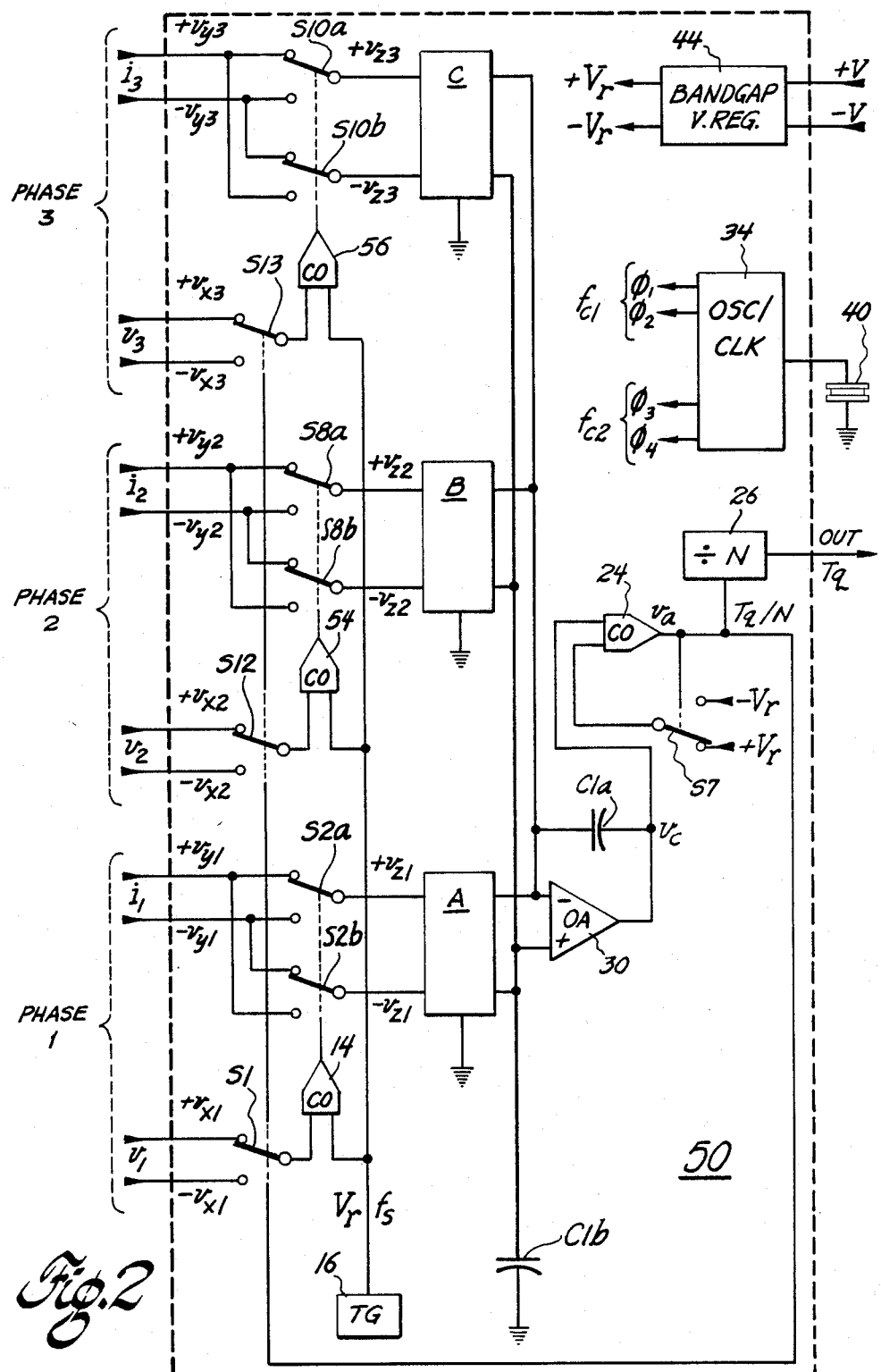
FIG. 2 is a schematic diagram of an electronic circuit similar to the circuit of FIG. 1 for measuring energy consumption in a polyphase electrical system.

The circuit of FIG. 1 has been described in connection with metering energy consumption in a single phase electrical system. FIG. 2 illustrates an electronic circuit 50 for metering energy consumption in a polyphase electrical system, the circuit being illustrated for a three-phase electrical system. Circuit 50, which is also preferably formed on a single integrated circuit chip 52, is similar to circuit 10 and corresponding elements are referenced by the same designators. The lower part of FIG. 2 for the Phase 1 input signals $v_1$ and $i_1$) corresponds identically to circuit 10 of FIG. 1, the switched-capacitor network A being illustrated in FIG. 2 as a block to simplify the drawing, and operates in the manner previously described. Circuit 50 further comprises, for Phases 2 and 3, polarity-reversing switches S12 and S13, respectively, which function in a manner similar to switch S1, and time division multipliers comprising a comparator 54 driving switches S8a and S8b for Phase 2 and a comparator 56 driving switches S10a and S10b for Phase 3. For each Phase i, where i=1,2,3, circuit 50 receives voltages $\pm v_{xi}$ proportional to the voltage in each phase and receives voltages $\pm v_{yi}$ proportional to the current in each phase. The time division multipliers multiply the voltages together, in the manner previously described, to form corresponding product signals $\pm v_{zi}$ proportional to instantaneous power in each phase. Circuit 50 further comprises, for Phases 2 and 3, switched input capacitor networks B and C for receiving corresponding product signals $\pm v_{z2}$ and $\pm v_{z3}$, respectively. Networks B and C are preferably identical to network A and function in the same manner as network A. The corresponding outputs of networks B and C are coupled to each other and, along with the outputs from network A, are coupled to the inverting and non-inverting inputs of amplifier 30, as shown. Accordingly, the total signal at the input of the integrator amplifier is $2v_z = 2(v_{z1} + v_{z2} + v_{z3})$ which is proportional to the polyphase instantaneous power, and the output signal of the integrator amplifier corresponds to the total average energy in the polyphase system. This output signal is quantized into pulses by comparator 24, as previously described, such that each pulse supplied from circuit 50 represents a predetermined amount of energy measured, for example, in watthours. Oscillator/clock generator 34 supplies clock signals to each of networks B and C, as well as to network A.

For metering three-phase power, the switched input capacitors (corresponding to capacitors C2a and C2b shown in FIG. 1) of networks A-C all have the same value. In addition, the geometries of corresponding switches of networks A, B, and C as well as multiplier switches S8a, S8b and S10a, S10b are the same so that the total charge injected into each of the inverting and non-inverting inputs of integrator amplifier 30 is the same. Thus, offset error voltages due to charge injection by the switches of networks A-C and DC offsets in the multipliers or the like of each phase are compensated by the common mode rejection characteristics of the amplifier.

Polarity reversing switches S1, S12 and S13 of circuit 50 may all be controlled simultaneously by the output voltage $v_a$ of comparator 24 for automatic correction of system offset error voltages, as previously described. In addition, as shown in FIG. 2, the triangular waveform sampling voltage for comparators 14, 54 and 56 of the time division multipliers of the three phases may be supplied in parallel from the output of sampling generator 16.

Figure 3:
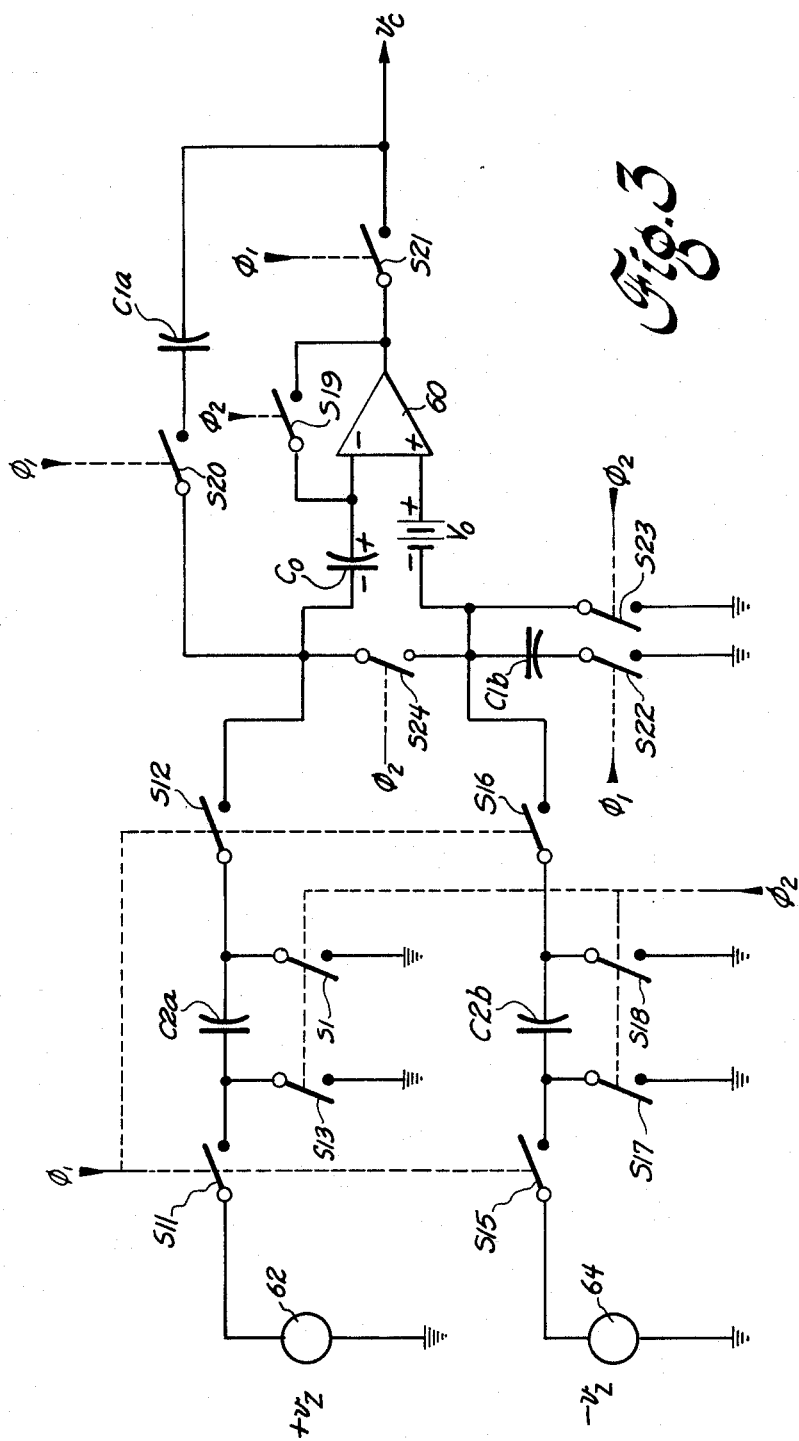
FIG. 3 is a schematic diagram of a switched-capacitor integrator in accordance with the invention which embodies means for cancelling internal offset voltages of the integrator amplifier.

Although the differential integrators of FIGS. 1 and 2 are effective for cancelling common mode offset voltages, the integrator amplifier itself may have an internal DC offset, and compensation of this offset may be required. FIG. 3 illustrates schematically an alternative embodiment of a differential integrator which employs internal DC offset cancellation and may be utilized in the circuits of FIGS. 1 and 2. In FIG. 3, the integrator amplifier is represented by an ideal amplifier 60 having a battery of voltage $V_O$, representing the internal DC offset of the amplifier, connected to the non-inverting terminal of the ideal amplifier. The integrator employs a switched input capacitor network which is slightly different from, but electrically equivalent to, network A of FIG. 1. This switched input capacitor network comprises an input capacitor C2a and associated switches S11–S14 for supplying the signal $+v_z$ to the inverting terminal of the amplifier, and a capacitor C2b and associated switches S15–S18 for supplying the signal $-v_z$ to the non-inverting terminal of the amplifier. Switches S11, S12, S15 and S16 are closed by phase $\phi1$ of clock signal $f_{cl}$, and switches S13, S14, S17 and S18 are closed by clock signal phase $\phi2$. Input voltages $+v_z$ and $-v_z$ are represented in the figure by signal sources 62 and 64, respectively. In order to compensate for the amplifier internal DC offset voltage $V_O$, a series capacitor $C_O$ may be connected between the inverting input of the amplifier and the output of switch S12, as shown. In addition, the output of the amplifier may be selectively connected to the inverting input through a feedback circuit including a switch S19 controlled by clock phase $\phi2$. Other switches S20 and S21 controlled by clock phase $\phi1$ connect feedback capacitor C1a between the output of the amplifier and the junction between capacitor $C_O$ and switch S12. A switch S22, also controlled by clock phase $\phi1$, enables capacitor C1b to be selectively grounded, and switch S23, controlled by clock phase $\phi2$, enables grounding of the negative (−) terminal of battery $V_O$. A switch S24, controlled by clock phase $\phi2$, selectively connects the input lines from switches S12 and S16 together.

As previously mentioned, the two clock phases are non-overlapped and 180 degrees out of phase. When one clock phase is at a predetermined logic level, e.g., high, the switches controlled by the one clock phase are closed, and the switches controlled by the other clock phase are open. Accordingly, during a first portion of a clock cycle, the switches controlled by clock phase $\phi1$ are closed and the switches controlled by clock phase $\phi2$ are opened. This portion of the clock cycle is referred to as the integration phase. During the next portion of the clock cycle, the phases of the clock signals reverse, so that the switches controlled by clock phase $\phi1$ are opened and the switches controlled by clock phase $\phi2$ are closed. This portion of the clock cycle is referred to as the autozero cycle.

During the autozero cycle, input capacitors C2a and C2b are grounded, and switches S19, S24, and S23 are closed. Accordingly, the amplifier 60 output voltage, which corresponds to internal DC offset voltage $V_O$, is fed back to the inverting terminal of the amplifier. This charges capacitor $C_O$ to voltage $V_O$ with polarity as indicated in the figure. During the integration portion of the clock cycle, input voltage $+v_z$ is connected to the inverting input of amplifier 60 in series with the voltage across capacitor $C_O$, and input voltage $-v_z$ is connected to the non-inverting input of the amplifier in series with battery voltage $V_O$. Since the voltage across capacitor $C_O$ in series with the inverting input of the amplifier is the same magnitude and polarity as the offset voltage $V_O$ supplied to the non-inverting input, the offset voltage is cancelled due to the common mode rejection characteristics of the amplifier. In this manner, the internal DC offset voltage of the amplifier is compensated.

The value of capacitor $C_O$ is selected so that the capacitor retains a charge equivalent to voltage $V_O$ over two consecutive clock pulses. The charge retained by the capacitor depends upon the value of leakage current and the time interval between clock pulses. The value of the capacitor may be determined from the following equation:

$$C_o = I_L(dT/dV) \tag{3}$$

where $I_L$ is the leakage current, dT is the integration time determined by the clock frequency, and dV is the permissible decrease in voltage across the capacitor due to leakage.

Figure 4:
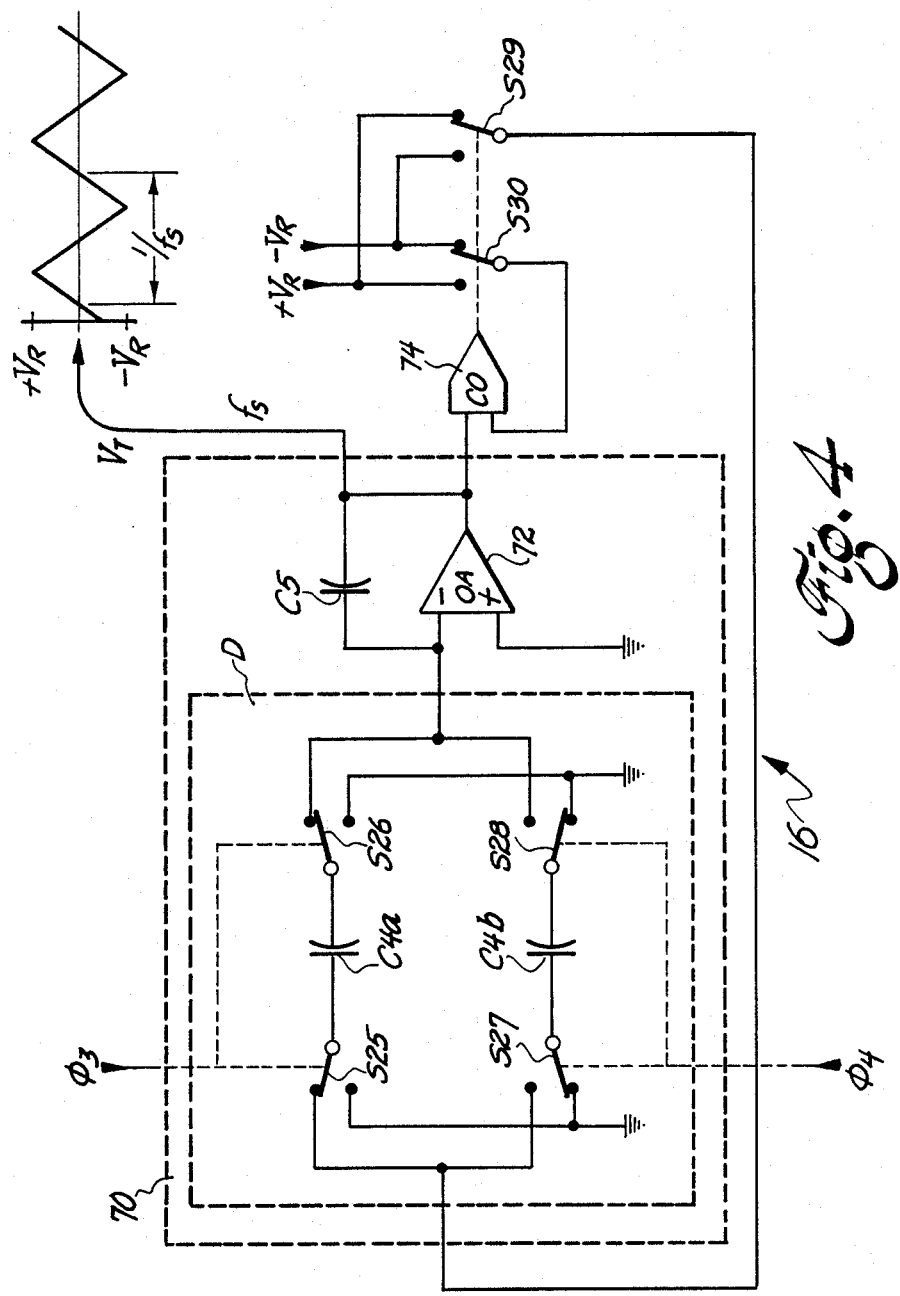
FIG. 4 is a schematic diagram of a triangular waveform sampling generator which may be employed in the invention.

FIG. 4 illustrates a preferred form of triangular waveform sampling frequency generator 16 shown in block diagram form in FIGS. 1 and 2. Generator 16 may comprise a continuous switched input capacitor dual slope integrator 70 having a switched input capacitor network D comprising capacitors C4a and C4b which are switched alternately by corresponding pairs of switches S25, S26 and S27, S28, respectively, between a first position at which one of the capacitors applies a reference voltage $+V_R$ or $-V_R$, as selected by switch S29, to the inverting input of an operational amplifier (OA) 72 and the other of the capacitors is connected to a reference potential, such as ground, and a second position at which the order of the aforesaid capacitor connections is reversed. Switches S25, S26 and S27, S28 may be controlled in pairs by non-overlapping clock phases $\phi3$ and $\phi4$ which are 180 degrees out of phase, in a manner similar to that previously described for the switches of network A of FIG. 1. The clock phases have a frequency $f_{c2}$ which is preferably large, for example, 60 KHz, in relation to the sampling frequency $f_s$, and may be derived from oscillator/clock generator 34, shown in FIG. 1. Integrator amplifier 72 has a feedback capacitor C5 connected between its output and its inverting input, and the output of the amplifier is coupled to one input of a comparator (CO) 74. The other input of comparator 74 is supplied with one of the reference voltages $\pm V_R$, as determined by the position of a switch S30. The output of comparator 74 controls the positions of switches S29 and S30. With all switches in the positions illustrated in FIG. 4, voltage $+V_R$ is applied to the input of network D and voltage $-V_R$ is applied to the second input of comparator 74. Integrator 70 integrates the input reference voltage so that the output signal of amplifier 72 is a decreasing ramp voltage. When the output signal of amplifier 72 reaches voltage $-V_R$, comparator 74 changes state and reverses the positions of switches S29 and S30. This reverses polarity of both the input voltage to network D and the reference voltage to comparator 74, so that the output voltage of integrator amplifier 72 increases. When the output voltage of amplifier 72 reaches $+V_R$, comparator 74 changes state once again, returning switches S29 and S30 to their original positions. Thus the output voltage of integrator amplifier 72 is a triangularly-shaped waveform $V_T$ as shown, formed by alternately increasing and decreasing ramp voltages which vary between the reference voltages $+V_R$ and $-V_R$ with slopes of $\pm(C4a/C5)f_{c2}$, when the open loop gain of amplifier 72 is much greater than one.

From the foregoing, it will be appreciated that the invention affords significant advantages in compensating for offset error voltages in electronic metering circuits which employ switched-capacitor integrators, and affords metering circuits having improved accuracy. Transient offset error voltages due to charge injection of MOS analog switches and DC offset voltages of multipliers and the like are substantially compensated by employing a differential switched input capacitor integrator.

While preferred embodiments of the invention have been shown and described, it will be appreciated by those skilled in the art that changes may be made in these embodiments without departing from the principles and the spirit of the invention, the scope of which is defined in the appended claims.

What is claimed is:

1. An electronic circuit for measuring energy consumption in an electrical system comprising:
   multiplying means for providing first and second signals of equal magnitude and opposite polarity, each of said signals representing instantaneous power in the electrical system;
   a switched-capacitor integrator for integrating said signals to provide a third signal representative of average energy, said integrator comprising a differential amplifier having an inverting input and a non-inverting input, a feedback capacitor connected between an output of the amplifier and the inverting input, a first switched-capacitor network coupled between the inverting input and said multiplying means for supplying the first signal to the inverting input, and a second switched-capacitor network coupled between the non-inverting input and said multiplying means for providing the second signal to the non-inverting input, said first and second switched-capacitor networks each comprising an input capacitor and analog switches for connecting the input capacitor between said multiplying means and a respective input of said amplifier or to a reference potential; and
   means for operating said switches such that during a first time interval said first and second signals are supplied substantially simultaneously to said amplifier inputs and during a second time interval said input capacitors are connected to said reference potential.

2. The circuit of claim 1 further comprising another capacitor connected between the non-inverting input of the amplifier and said reference potential.

3. The circuit of claim 1 wherein said analog switches comprise a first pair of switches for switching the input capacitor of the first switched-capacitor network between a first position at which connection is made to said multiplying means and to the inverting input of said amplifier and a second position at which connection is made to said reference potential, and a second pair of switches for switching the input capacitor of said second switched-capacitor network between a third position at which connection is made to said multiplying means and to the non-inverting input of said amplifier and a fourth position at which connection is made to said reference potential.

4. The circuit of claim 3 wherein each switch of said first and second pairs comprises an integrated circuit analog switch having a predetermined geometry, and wherein the geometries of the switches of the first pair are matched to the geometries of corresponding switches of the second pair such that substantially the same charge is injected into each of said inverting and non-inverting inputs by said pairs of switches.

5. The circuit of claim 1 further comprises means for compensating for an internal DC offset voltage of said amplifier, said compensating means comprising means for inserting in series with the output of said multiplying means supplying said first signal and the inverting input of the amplifier a voltage source having a value and polarity equal to said internal DC offset voltage.

6. The circuit of claim 5 wherein said voltage source comprises a series capacitor connected between the inverting input of said amplifier and said first switched-capacitor network, and means for charging said series capacitor to a voltage equal to the internal DC offset voltage during said second time interval.

7. The circuit of claim 6 wherein said charging means comprises switching means operable during said second time interval for connecting said series capacitor and the non-inverting input of said amplifier to said reference potential and for applying to said series capacitor a voltage from the output of said amplifier equal to said internal DC offset voltage.

8. The circuit of claim 7 wherein said series capacitor is selected to have a value with reference to leakage current and said first and second time intervals such that the series capacitor retains a predetermined charge during said first time interval.

9. The circuit of claim 1 wherein said multiplying means multiplies a fourth signal proportional to the electrical system voltage and a fifth signal proportional to the electrical system current to provide said first and second signals representative of instantaneous power, said multiplying means comprising a first comparator receiving at a first input thereof one of said fourth and fifth signals and receiving at a second input thereof a triangular waveform sampling frequency, and an additional pair of analog switches controlled by said comparator, each switch of said additional pair receiving the other of said fourth and fifth signals and a sixth signal of equal magnitude to said other signal but of opposite polarity, the switches of said additional pair having outputs providing said first and second signals.

10. The circuit of claim 9 further comprising a second comparator coupled to the output of said integrator for converting said third signal into a train of pulses, each of said pulses representing a predetermined amount of energy, and means responsive to said second comparator for reversing polarity of the signal applied to the first input of said first comparator so as to reverse polarities of the first and second signals provided to the integrator so as to compensate for offset error voltage.

11. An electronic circuit for measuring energy consumption in an electrical system comprising, on an integrated circuit chip:
   multiplying means for providing first and second signals of equal magnitude and opposite polarity, each of said signals representing instantaneous power in the electrical system;
   a differential switched-capacitor integrator for integrating said first and second signals to provide a third signal representative of average power, said switched-capacitor integrator comprising a differential amplifier having inverting and non-inverting inputs; and
   network means coupled to said amplifier for supplying samples of the first and second signals to said inputs repetitively and substantially simultaneously.

12. The circuit of claim 11 wherein said network means comprises a first input capacitor and a first pair of integrated circuit switches for alternately connecting the first input capacitor in a first configuration at which the first input capacitor is connected between the inverting input of said amplifier and the multiplying means and in a second configuration at which the first input capacitor is connected to ground, and a second input capacitor and a second pair of integrated circuit switches for alternately connecting the second input capacitor in a third configuration at which the second input capacitor is connected between the non-inverting input of said amplifier and the multiplying means and in a fourth configuration at which the second input capacitor is connected to ground, each integrated circuit switch of said first and second pairs having a predetermined geometry, the geometries of the integrated circuit switches of either pair being matched to corresponding integrated circuit switches of the other pair such that substantially the same charge is injected into each input of said amplifier by said integrated circuit switches.

13. The circuit of claim 12 further comprising compensation means for compensating for an internal DC offset voltage of said amplifier, said compensation means comprising a series capacitor connected to the inverting input of said amplifier and to said first input capacitor and first pair of integrated circuit switches, and charging means coupled to said series capacitor and to the inverting input of said amplifier for charging said series capacitor to a voltage having the same magnitude and polarity as said internal DC offset voltage and for applying the voltage on said series capacitor to the inverting input of said amplifier so as to cancel said internal DC offset voltage.

14. The circuit of claim 13 wherein said charging means comprises switching means operable during a first time interval to connect the series capacitor and the non-inverting input of said amplifier to ground and to apply to the series capacitor an output voltage from said amplifier corresponding to said internal DC offset voltage, said switching means being operable during a second time interval to connect the series capacitor in series with said first input capacitor so that voltage on said series capacitor is added to the first signal voltage applied to the inverting input of said amplifier.

15. The circuit of claim 14 wherein said switching means comprises third and fourth sets of switches, the third set of switches being operable during said first time interval and comprising means for connecting the output of said amplifier to the inverting input of said amplifier, means for connecting the non-inverting input of the amplifier to ground, and means for connecting a junction common to said series capacitor, said first input capacitor and said first pair of switches, to the second switch, and the fourth set of switches being operable during said second time interval and comprising means for connecting a feedback capacitor between the output of the amplifier and said junction, and means for connecting another capacitor between the non-inverting input of said amplifier and ground.

16. The circuit of claim 11 wherein said multiplying means comprises a multiplier for multiplying a fourth signal proportion to voltage in said system and a fifth signal proportional to current in said system to provide said first and second signals representing instantaneous power, said multiplying means comprising pulse width modulation means for receiving at a first input thereof one of a fourth signal proportional to voltage in said electrical system and a fifth signal proportional to current in said electrical system and for receiving at a second input thereof a sampling frequency and providing a pulse width modulated output signal in response thereto, and a pair of integrated circuit switches for receiving the other of said fourth and fifth signals and receiving a sixth signal equal in magnitude to said other of said fourth and fifth signals but of opposite polarity thereto, said pair of switches being coupled to said pulse width modulation means so as to be controlled by the pulse width modulated output signal.

17. The circuit of claim 16 further comprising comparator means coupled to said integrator for converting said third signal into a train of pulses, and means coupled to said comparator means and responsive to said train of pulses for reversing polarity of said one signal received at the first input of said modulation means so as to reverse polarities of the first and second signals to compensate for circuit offset errors.

18. The circuit of claim 11 wherein said electrical system comprises a plural phase electrical system, said multiplying means includes means for providing additional first and second signals representative of instantaneous power in each additional phase, respectively, and said network means further comprises means for supplying samples of the corresponding first and second signals representative of instantaneous power in each said additional phase to said inverting and non-inverting inputs of said amplifier.

* * * * *